United States Patent
Yang et al.

(10) Patent No.: US 12,525,954 B2
(45) Date of Patent: Jan. 13, 2026

(54) LOW G-SENSITIVITY CRYSTAL RESONATOR

(71) Applicant: TAITIEN ELECTRONICS CO., LTD., New Taipei (TW)

(72) Inventors: Chien-Cheng Yang, New Taipei (TW); Shing-Tai Song, New Taipei (TW); Sheng-Shian Li, Taoyuan (TW); Po-Cheng Hsieh, New Taipei (TW); Chin-Yu Chang, Taipei (TW)

(73) Assignee: TAITIEN ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 18/819,983

(22) Filed: Aug. 29, 2024

(65) Prior Publication Data
US 2025/0219617 A1  Jul. 3, 2025

(51) Int. Cl.
*H03H 9/19* (2006.01)

(52) U.S. Cl.
CPC .................................... *H03H 9/19* (2013.01)

(58) Field of Classification Search
CPC .... H03H 9/19; H03H 9/02086; H03H 9/0207; H03H 9/0509; H03H 9/0519; H03H 9/132; H03H 9/566; H03H 9/2062
See application file for complete search history.

(56) References Cited

U.S. PATENT DOCUMENTS

| 4,388,548 A | * | 6/1983 | Vangheluwe | H03H 9/56 310/365 |
| 4,870,313 A | * | 9/1989 | Hirama | H03H 9/174 310/326 |
| 5,132,643 A | | 7/1992 | Ueno et al. | |

OTHER PUBLICATIONS

Search Report appended to an Office Action, which was issued to Taiwanese counterpart application No. 112151103 by the TIPO on Oct. 24, 2024, with an English translation thereof (2 pages).

* cited by examiner

*Primary Examiner* — Jeffrey M Shin
(74) *Attorney, Agent, or Firm* — HSML P.C.

(57) ABSTRACT

A crystal resonator includes a crystal plate and an electrode set. The crystal plate includes a first vibration section and a second vibration section arranged along an oscillating direction, and exhibits a thickness shear mode. The electrode set includes a first electrode pair disposed on the first vibration section, and a second electrode pair disposed on the second vibration section. The first electrode pair and the second electrode pair are configured to apply the applied voltages with opposite electrical polarities to the first vibration section and the second vibration section, respectively, which causes the first vibration section and the second vibration section to dynamically deform in the thickness shear mode along the oscillating direction, and do out of phase motion with respect to each other.

12 Claims, 14 Drawing Sheets

LOW G-SENSITIVITY CRYSTAL RESONATOR

CROSS-REFERENCE TO RELATED APPLICATION

This application claims priority to Taiwanese Invention Patent Application No. 112151103, filed on Dec. 27, 2023, and incorporated by reference herein in its entirety.

FIELD

The disclosure relates to a resonator, and more particularly to a crystal resonator that is formed to have a relatively low g-sensitivity.

BACKGROUND

FIG. 1 illustrates a conventional crystal resonator 1. The conventional crystal resonator 1 is adapted to be installed in an oscillation circuit, and may be used as an electronic component for providing a steady signal at a specific frequency oscillation signal. The conventional crystal resonator 1 includes a crystal plate 11 and a pair of electrodes 12 that are disposed respectively on two sides of the crystal plate 11 with respect to a thickness axis (as indicated by an arrow (Z) in FIG. 1). The pair of electrodes 12 are connected respectively to two conductive members 13 (such as conductive paste, conductive anchor, etc.), so as to be electrically connected to the resonant circuit. In use, the pair of electrodes 12 may be applied with electrical signals having different electrical potentials, so as to create a voltage difference between the pair of electrodes 12. In response to receipt of the electrical signals, the two surfaces of the crystal plate 11 are driven to move in unsynchronized motions (also known as out of phase movements), thereby causing the crystal plate 11, as a whole, to oscillate at the specific oscillating frequency, and outputting the oscillation signal.

It is noted that, while outputting the oscillation signal, if the crystal resonator 1 is affected by external inertial forces to have a sudden move that causes an acceleration in an undesired manner (e.g., tilt, rotate, shock, etc.), the resulting oscillation of the crystal resonator 1 may be adversely affected. For example, the oscillation signal generated by the crystal resonator 1 may have a frequency shift due to the acceleration, meaning that the oscillation signal may have a frequency different from the specific oscillating frequency.

SUMMARY

In general, in the field of resonators, a g-sensitivity (a frequency change due to an acceleration event) is an important specification for a resonator, and it is desirable to have a relatively low g-sensitivity to ensure the performance of the resonator.

Therefore, an object of the disclosure is to provide a crystal resonator with a reduced g-sensitivity.

According to one embodiment of the disclosure, the crystal resonator includes a crystal plate and an electrode set. The crystal resonator is formed integrally, and includes a first vibration section and a second vibration section connected to each other and arranged along an oscillating direction not parallel to a thickness direction. The crystal plate exhibits a thickness shear mode, in which the crystal plate is driven to change shape in the oscillating direction when applied with two applied voltages.

The electrode set includes a first electrode pair disposed on the first vibration section, and a second electrode pair disposed on the second vibration section. The first electrode pair and the second electrode pair are configured to apply the applied voltages with opposite electrical polarities to the first vibration section and the second vibration section, respectively, which causes the first vibration section and the second vibration section to dynamically deform in the thickness shear mode along the oscillating direction. In the thickness shear mode, the first vibration section and the second vibration section do out of phase motion with respect to each other.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
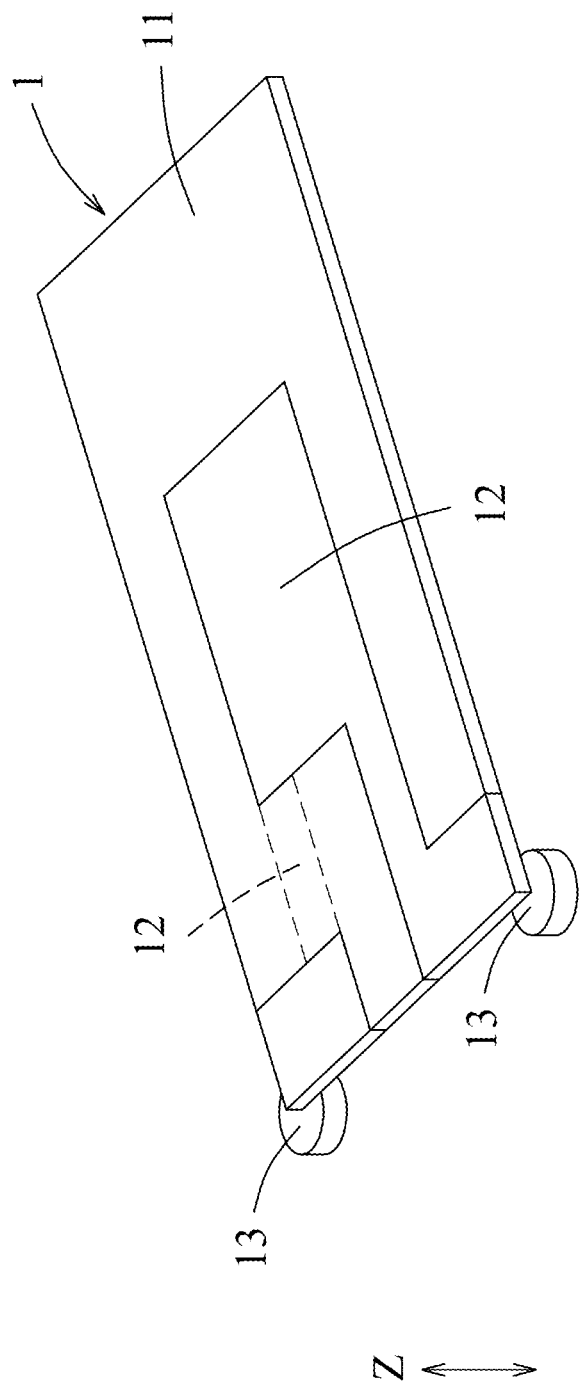
FIG. 1 illustrates a conventional crystal resonator.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper,"

"lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Throughout the disclosure, the term "coupled to" or "connected to" may refer to a direct connection among a plurality of electrical apparatus/devices/equipment via an electrically conductive material (e.g., an electrical wire), or an indirect connection between two electrical apparatus/devices/equipment via another one or more apparatus/devices/equipment, or wireless communication.

Figure 2:
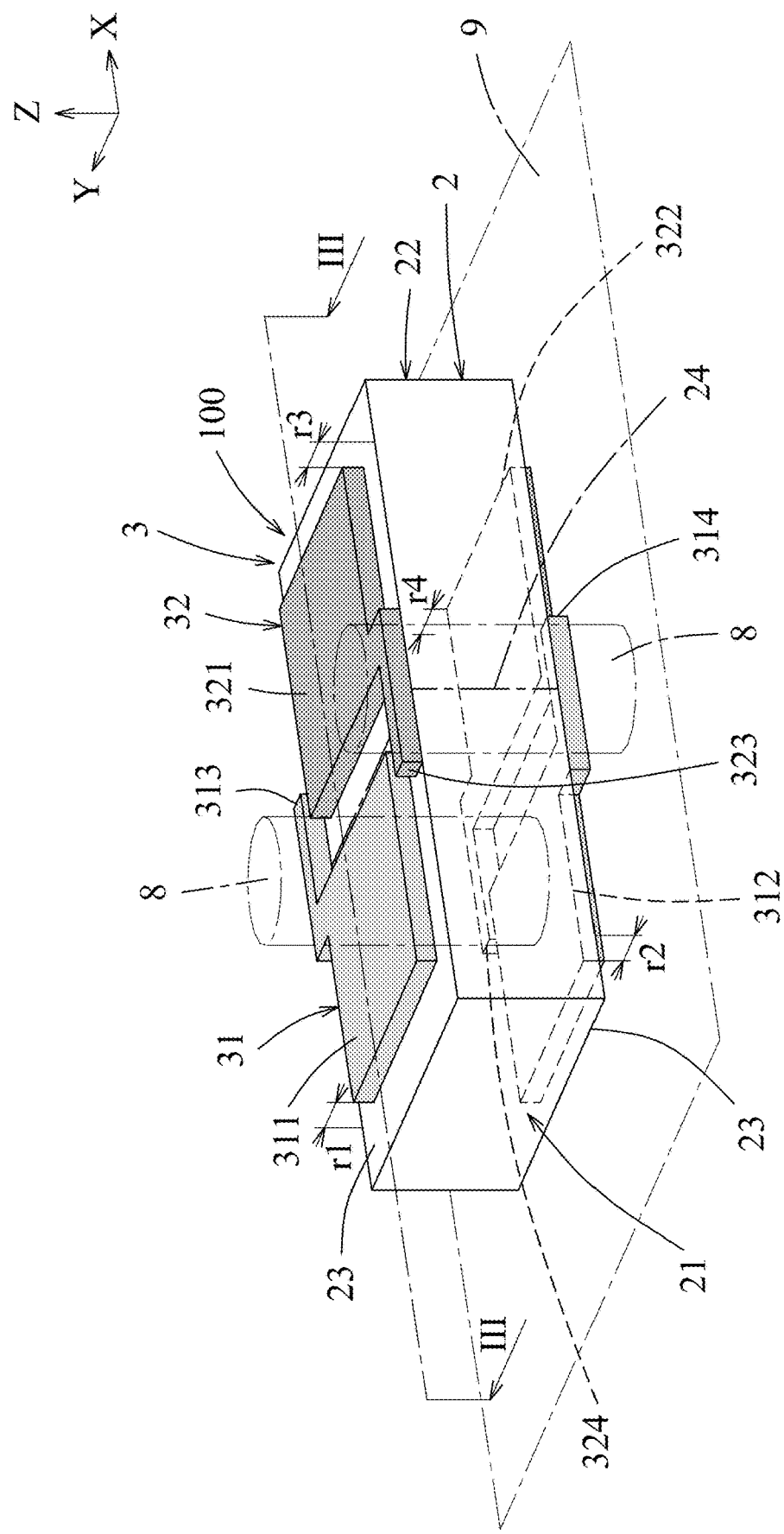
FIG. 2 is a perspective view of a crystal resonator according to one embodiment of the disclosure.

FIG. 2 is a perspective view of a crystal resonator 100 according to one embodiment of the disclosure. In this embodiment, the crystal resonator 100 is to be electrically connected to a base 9 via two conductive securing members 8. In this embodiment, the base 9 may be embodied using a semiconductor package with electronic circuitry patterns formed thereon, or may be other suitable components in various embodiments. The conductive securing members 8 may be embodied using an electrically conductive material such as a metal material, but is not limited to such. In use, the conductive securing members 8 may be secured on the base 9 using silver paste or a solder material (e.g., Tin), and the crystal resonator 100 may be secured on the conductive securing members 8 using a similar material thereof. Therefore, the crystal resonator 100 may be indirectly connected to the base 9, and may be suspended with respect to the base 9 by the conductive securing members 8.

In the embodiment of FIG. 2, the crystal resonator 100 includes a crystal plate 2 and an electrode set 3.

The crystal plate 2 is disposed to engage the conductive securing members 8, and is spaced apart from the base 9 in a thickness direction (Z) (as indicated by the arrow (Z) in FIG. 2). The crystal plate 2 may be formed using a suitable material such as quartz, or other materials that may have similar physical characteristics (e.g., a piezoelectric effect).

It is noted that for the sake of simplified description, in the embodiment of FIG. 2, an up-down direction associated with the crystal resonator 100 is defined as the thickness direction (Z). A left-right direction associated the crystal resonator 100 is defined as an oscillating direction (X) (as indicated by the arrow (X) in FIG. 2), which is not parallel to the thickness direction (Z). A front-rear direction associated the crystal resonator 100 is defined as a width direction (Y) (as indicated by the arrow (Y) in FIG. 2), which is not parallel to the thickness direction (Z). In the embodiment of FIG. 2, the oscillating direction (X), the width direction (Y) and the thickness direction (Z) are perpendicular to one another.

In the embodiment of FIG. 2, the crystal plate 2 is cut in a specific manner to exhibit a specific oscillation mode, such as a thickness shear mode. In the thickness shear mode, the crystal plate 2 may be driven to change shape in the oscillating direction (X) when applied with electrical voltages. Typically, after the electrical voltages are applied to cause the changes in shape of the crystal plate 2, when the electrical voltages are removed, the crystal plate 2 may be driven to move back to the original shape. Generally, in response to the applied voltages, a part of the crystal plate 2 may be said to dynamically deform (that is, the part of the crystal plate 2 deforms according to the applied voltage, and with the applied voltage continuously changing, the part of the crystal plate 2 also continuously deforms into different shapes). The arrows in FIG. 4 indicate the movements of different parts of the crystal plate 2 in a specific time instance. By repeating the above process, the movements of different parts of the crystal plate 2 may constitute an oscillation.

The crystal plate 2 is in the form of a sheet, is formed integrally, and includes a first vibration section 21, a second vibration section 22, and two opposite crystal surfaces 23. The first vibration section 21 and the second vibration section 22 are aligned with respect to the oscillating direction (X), and are connected to each other via a junction surface 24. In this embodiment, the first vibration section 21 and the second vibration section 22 have identical shapes (that is, the first vibration section 21 and the second vibration section 22 have identical dimensions along each of the oscillating direction (X), the width direction (Y) and the thickness direction (Z)), and the junction surface 24 is located in a middle point of the crystal plate 2 along the oscillating direction (X).

Figure 3:
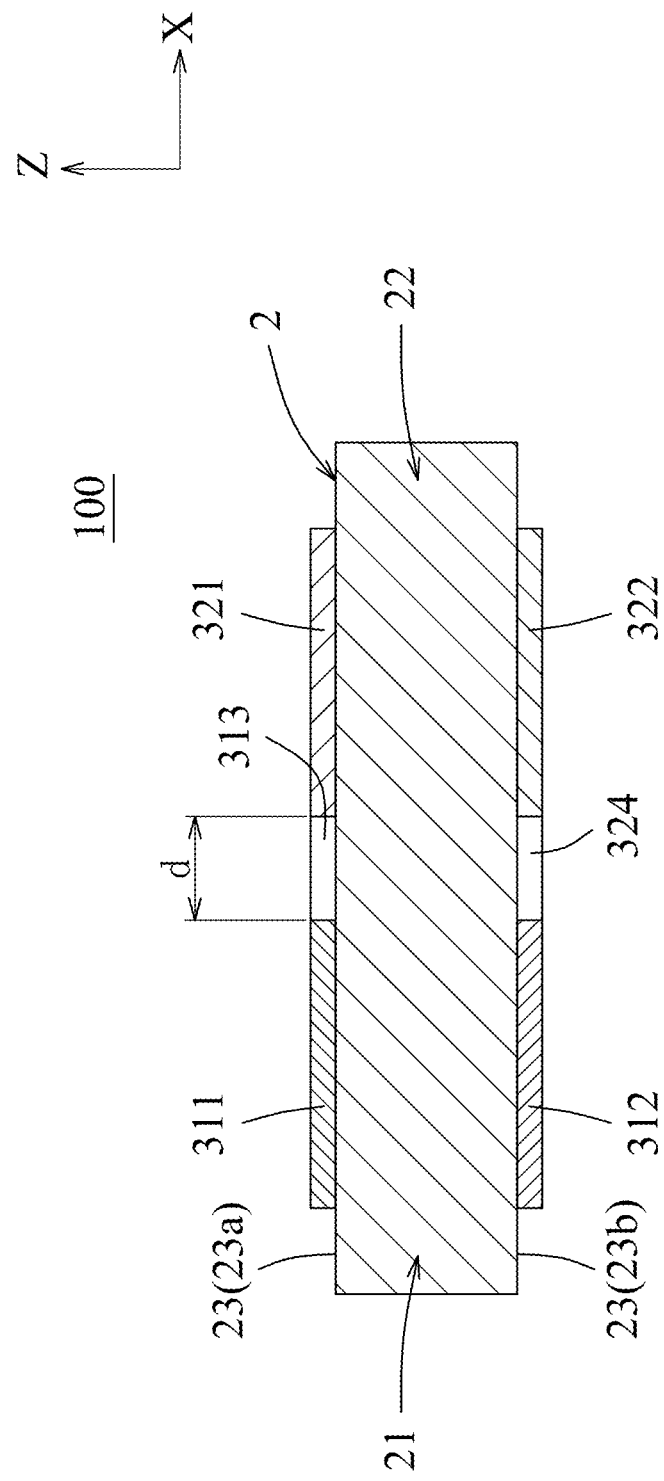
FIG. 3 is a fragmentary sectional view of the crystal resonator taken along line III-III' in FIG. 2 and omitting the conductive securing members and the base.

FIG. 3 is a fragmentary sectional view of the crystal resonator 100 taken along line III-III in FIG. 2 and omitting the conductive securing members 8 and the base 9.

As shown in FIG. 3, the crystal surfaces 23 are formed respectively on a top surface of the crystal plate 2 and a bottom surface of the crystal plate 2 along the thickness direction (Z). The crystal surfaces 23 extend in parallel with the oscillating direction (X) and perpendicular to the thickness direction (Z). Each of the crystal surfaces 23 contains a part of the first vibration section 21 and a part of the second vibration section 22 on one side of the crystal plate 2. For example, in the example of FIG. 3, the crystal surface 23a is collectively a top surface of the first vibration section 21 and a top surface of the second vibration section 22, and the crystal surface 23b is collectively a bottom surface of the first vibration section 21 and a bottom surface of the second vibration section 22. In the embodiment of FIG. 3, each of the crystal surfaces 23 has a shape of a rectangle with two longer sides extending along the oscillating direction (X), and two shorter sides extending along the width direction (Y) (that is, a dimension of the crystal plate 2 along the oscillating direction (X) is larger than a dimension of the crystal plate 2 along the width direction (Y)), however, the shape of each of the crystal surfaces 23 is not limited to that as depicted in FIG. 3. It is noted that in other embodiments, the crystal surfaces 23 may have other shapes such as a polygon, a circle, an ellipse, etc.

Figure 4:
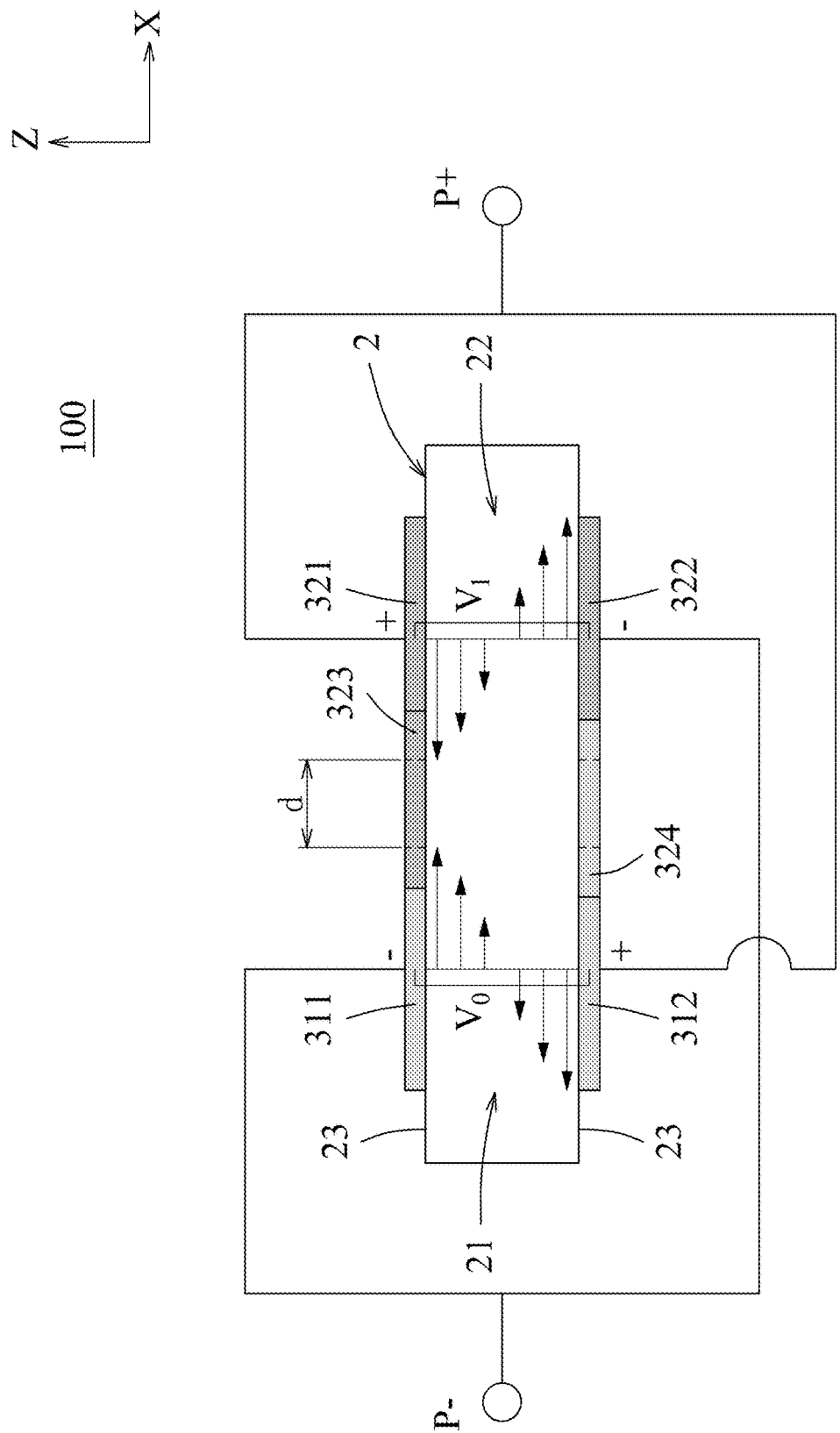
FIG. 4 illustrates movements in the crystal resonator in response to receipt of electrical signals via the electrode set.

FIG. 4 illustrates movements in the crystal resonator 100 in response to receipt of electrical signals via the electrode set 3. In use, the electrode set 3 includes a first electrode pair 31 that is disposed on the first vibration section 21, and a second electrode pair 32 that is disposed on the second vibration section 22.

In use, each of the first electrode pair 31 and the second electrode pair 32 are electrically connected to an external power source that supplies an electrical signal. Specifically, the first electrode pair 31 and the second electrode pair 32 are electrically connected to the two conductive securing members 8, and the two conductive securing members 8 may be electrically connected to two ports of the external power source, respectively. The two ports of the external power source may respectively supply applied electrical potentials with different values (i.e., a high electrical potential such as a positive electrical potential and a low electrical potential such as a negative electrical potential), and due to the reverse piezoelectric effect created by the different electrical potentials (i.e., an applied voltage), a mechanical strain is internally generated by the electrical signals, and the first vibration section 21 and the second vibration section 22 are driven by the mechanical strain to move in the thickness shear mode along the oscillating direction (X), as indicated by arrows in FIG. 4.

It is noted that for the sake of a more clear illustration, the first electrode pair 31 and the second electrode pair 32 are depicted in the drawings using different shades of gray, with the first electrode pair 31 being represented using a lighter shade of gray, but in use, the first electrode pair 31 and the second electrode pair 32 may be embodied using the same component.

The first electrode pair 31 includes an input node electrode 311, a back electrode 312, an input node connecting electrode 313 and a back connecting electrode 314.

As shown in FIGS. 2 and 3, the input node electrode 311 and the back electrode 312 are disposed on the two opposite top and bottom surfaces of the first vibration section 21, and are aligned with each other with respect to the thickness direction (Z). The input node connecting electrode 313 extends from the input node electrode 311, and has an end that is connected to an upper portion of one of the conductive securing members 8 (e.g., one that is distal in the point of view in FIG. 2). The back connecting electrode 314 extends from the back electrode 312, and has an end that is connected to a lower portion of the other one of the conductive securing members 8. In this embodiment, the input node electrode 311 is disposed on one surface of the first vibration section 21 (the top surface in FIG. 3), and has a distance $r_1$ extending from an edge of the first vibration section 21 along the oscillating direction (X) (e.g., one that is distal in the point of view in FIG. 2). The back electrode 312 is disposed on the other surface of the first vibration section 21 (the bottom surface in FIG. 3), and has a distance 2 extending from an edge of the first vibration section 21 along the oscillating direction (X) (e.g., one that is proximal in the point of view in FIG. 2). In this embodiment, the distance $r_1$ is equal to the distance $r_2$.

It is noted that in this embodiment, the input node electrode 311 and the back electrode 312 have identical shapes and dimensions, and are aligned with each other with respect to the thickness direction (Z), and the distance $r_1$ is equal to the distance $r_2$. Nonetheless, in other embodiments, the input node electrode 311 and the back electrode 312 may have different shapes and/or dimensions, and therefore are partially aligned with each other with respect to the thickness direction (Z). Alternatively, the distance $r_1$ may not be equal to the distance $r_2$, and as such the input node electrode 311 and the back electrode 312 are partially aligned with each other with respect to the thickness direction (Z). In practice, as long as the input node electrode 311 and the back electrode 312 are at least partially aligned with each other with respect to the thickness direction (Z), the electrical signals supplied to the first electrode pair 31 and the second electrode pair 32 may apply an applied voltage to the first vibration section 21 as indicated in FIG. 4.

The second electrode pair 32 includes an output node electrode 321, a back electrode 322, an output node connecting electrode 323 and a back connecting electrode 324, and it is in a configuration that is similar to the first electrode pair 31.

As shown in FIGS. 2 and 3, the output node electrode 321 and the back electrode 322 are disposed on the two opposite top and bottom surfaces of the second vibration section 22, and are aligned with each other with respect to the thickness direction (Z). The output node connecting electrode 323 extends from the output node electrode 321, and has an end that is connected to an upper portion of the other one of the conductive securing members 8 (e.g., one that is proximal in the point of view of FIG. 2). The back connecting electrode 324 extends from the back electrode 322, and has an end that is connected to a lower portion of the one of the conductive securing members 8 (e.g., one that is distal in the point of view of FIG. 2). In this embodiment, the output node electrode 321 is disposed on one surface of the second vibration section 22 (the top surface in FIG. 3), and has a distance $r_3$ extending from an edge of the second vibration section 22 along the oscillating direction (X) (e.g., one that is proximal in the point of view in FIG. 2). The back electrode 322 is disposed on the other surface of the second vibration section 22 (the bottom surface in FIG. 3), and has a distance $r_4$ extending from an edge of the second vibration section 22 along the oscillating direction (X) (e.g., one that is distal in the point of view in FIG. 2). In this embodiment, the distance $r_3$ is equal to the distance $r_4$.

It is noted that in this embodiment, the output node electrode 321 and the back electrode 322 have identical shapes and dimensions, are aligned with each other with respect to the thickness direction (Z), and the distance $r_3$ is equal to the distance $r_4$. Nonetheless, in other embodiments, the output node electrode 321 and the back electrode 322 may have different shapes and/or dimensions, and therefore are partially aligned with each other with respect to the thickness direction (Z). Alternatively, the distance $r_3$ may not be equal to the distance $r_4$, and as such the output node electrode 321 and the back electrode 322 are partially aligned with each other with respect to the thickness direction (Z). In practice, as long as the output node electrode 321 and the back electrode 322 are at least partially aligned with each other with respect to the thickness direction (Z), the electrical signals supplied to the first electrode pair 31 and the second electrode pair 32 may apply an applied voltage to the second vibration section 22 as indicated in FIG. 4.

In this embodiment, the input node electrode 311 and the output node electrode 321 are disposed on a same surface of the crystal plate 2 (e.g., the top surface as shown in FIG. 2), and are arranged to be spaced apart from each other along the oscillating direction (X). The back electrode 312 and the back electrode 322 are disposed on a same surface of the crystal plate 2 (e.g., the bottom surface as shown in FIG. 2), and are arranged to be spaced apart from each other along the oscillating direction (X).

In use, the back electrode 312 and the output node electrode 321 are electrically connected, and therefore receive the same electrical signal. The back electrode 322 and the input node electrode 311 are electrically connected, and therefore receive another same electrical signal. In a case where the back electrode 312 and the output node electrode 321 receive a high electrical potential P+, and the back electrode 322 and the input node electrode 311 receive a low electrical potential P−, an applied voltage $V_0$ between the input node electrode 311 and the back electrode 312 is created, and another applied voltage $V_1$ that is between the output node electrode 321 and the back electrode 322 and that has an opposite electrical polarity to the applied voltage $V_0$ is created. The applied voltage $V_0$ and the applied voltage $V_1$ cooperatively cause an upper part of the first vibration section 21 and a lower part of the first vibration section 21 to move oppositely along the oscillating direction (X), and cause an upper part of the second vibration section 22 and a lower part of the second vibration section 22 to move oppositely along the oscillating direction (X). Specifically, when applied with the applied voltage $V_0$ and the applied voltage $V_1$, as indicated by the arrows shown in FIG. 4, the upper part of the first vibration section 21 and the upper part of the second vibration section 22 move toward each other, and the lower part of the first vibration section 21 and the lower part of the second vibration section 22 move away from each other. In other uses, one of the input node electrode 311 and the output node electrode 321 may receive the high electrical potential P+, and the other one of the input node electrode 311 and the output node electrode 321 may receive the low electrical potential P−. It is noted that generally, the movements of the different parts of the crystal plate 2 (e.g., the first vibration section 21 and the second vibration section 22) as described throughout the disclosure may be referred to as out of phase movements with respect to each other, as the different parts of the crystal plates 2, in response to receipt of different applied voltages, dynamically deform in different manners (e.g., as indicated in FIG. 4).

In general, the first electrode pair 31 and the second electrode pair 32 are configured to apply the two applied voltages to the first vibration section 21 and the second vibration section 22, respectively. The applied voltages have opposite electrical polarities, therefore causing the first vibration section 21 and the second vibration section 22 to change shape in the thickness shear mode. In the thickness shear mode, the upper parts of the first vibration section 21 and the second vibration section 22 move toward each other while the lower parts of the first vibration section 21 and the second vibration section 22 move away from each other.

In this configuration, while the first vibration section 21 and the second vibration section 22 are oscillating as described above and as shown in FIG. 4, an external force applied to the crystal plate 2 may be partially nullified by the opposite oscillations of the parts of the first vibration section 21 and the second vibration section 22. As such, the undesired effect of frequency shift resulting from acceleration caused by the external force applied to the crystal plate 2 may be reduced, and therefore a g-sensitivity of the crystal resonator 100 is reduced.

Referring to FIGS. 3 and 4, in some embodiments, the input node electrode 311 and the output node electrode 321 are disposed to be spaced apart from each other by a predetermined distance (d). In some embodiments, the predetermined distance (d) is between 0 and 0.5 millimeter.

Referring to FIG. 2, in some embodiments, the junction surface 24 is located in the middle point of the crystal plate 2 along the oscillating direction (X), separating the first vibration section 21 and the second vibration section 22. Additionally, the junction surface 24 extends along a plane defined by the width direction (Y) and the thickness direction (Z), and has two vertical edges that extend along the thickness direction (Z) and that are connected to the conductive securing members 8, respectively. In this configuration, the crystal plate 2 may be suspended with respect to the base 9 in the middle point by the conductive securing members 8 in a balanced manner.

Figure 5:
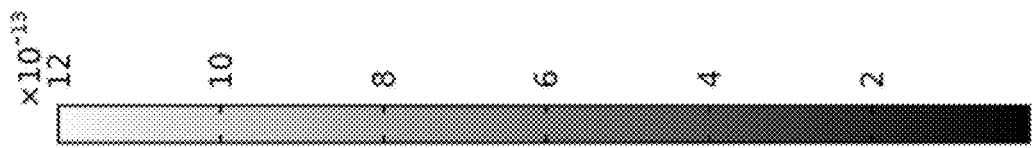
FIG. 5 is a graph illustrating a simulation result of vibration displacements associated with different parts of the first vibration section and the second vibration section in the thickness shear oscillation mode when the first vibration section and the second vibration section are subjected to applied voltages according to one embodiment of the disclosure.
Figure 5:
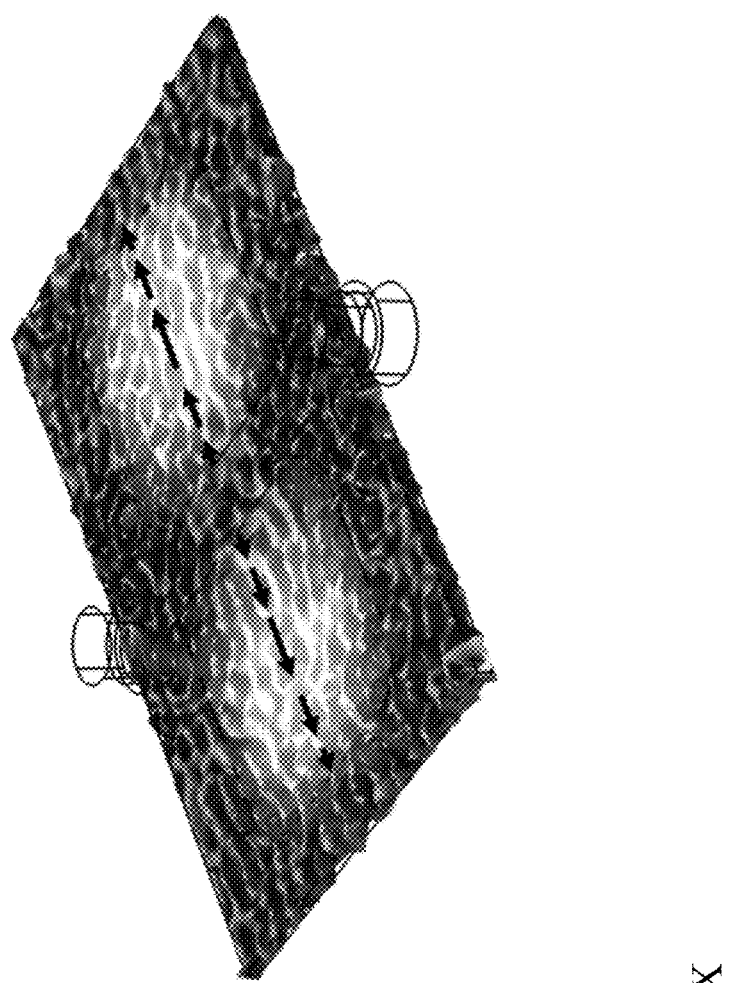
Figure 5:
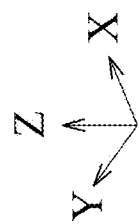

FIG. 5 is a graph illustrating a simulation result of oscillation displacements associated with different parts of the first vibration section 21 and the second vibration section 22 in the shear oscillation mode when the first vibration section and the second vibration section are subjected to the applied voltages according to one embodiment of the disclosure. It is noted that in FIG. 5, the arrows indicate that the first vibration section 21 and the second vibration section 22 are oscillating away from each other along the oscillating direction (X) (i.e., the upper parts of the first vibration section 21 and the second vibration section 22 move away from each other). The different shades of gray indicate different amounts of oscillation displacements, with a lighter shade of gray indicating a larger oscillation displacement, and a darker shade of gray indicating a smaller oscillation displacement.

It is noted that in the embodiment of FIG. 2, each of the input node electrode 311 and the output node electrode 321 has an upper side extending along the oscillating direction (X) and perpendicular to the thickness direction (Z), and the upper side is in the shape of a rectangle and is disposed to cover the two areas of the first vibration section 21 and the second vibration section 22 with the lighter shade of gray in FIG. 5, respectively. However, in other embodiments, the shape of the upper side of each of the input node electrode 311 and the output node electrode 321 may be a polygon, or may be other shapes, such as a circle, an ellipse, etc., which is sufficient to cover a respective one of the two areas with the lighter shade of gray in FIG. 5.

Figure 6:
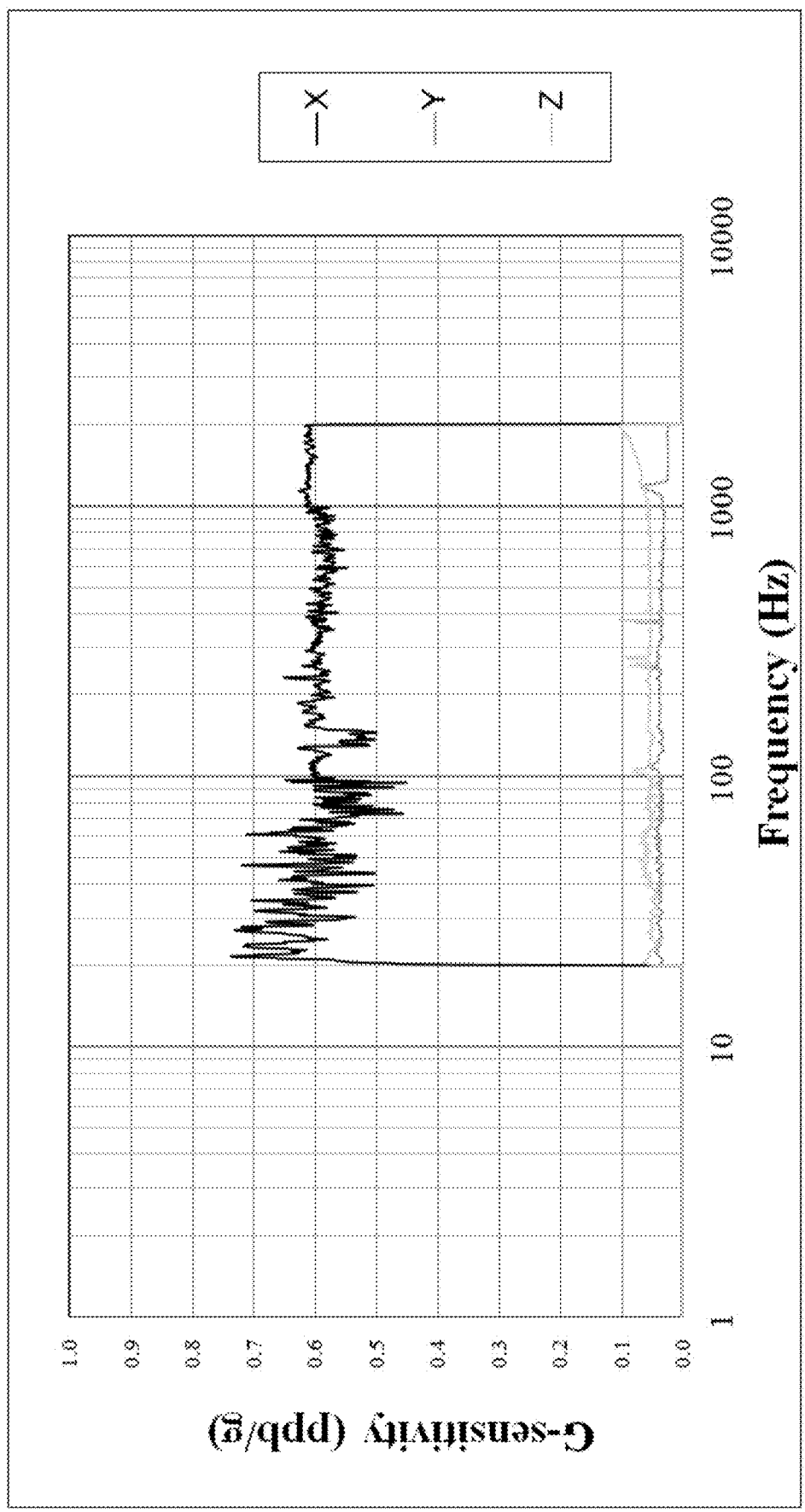
FIG. 6 is a chart illustrating test results of different g-sensitivities of a conventional crystal resonator at different oscillating frequencies.

FIG. 6 is a chart illustrating test results of different g-sensitivities of a conventional crystal resonator at different oscillating frequencies. In FIG. 6, when different electrical signals are applied, the oscillating frequencies may be in a range between 20 and 2000 hertz, and a set of g-sensitivities with respect to each of the oscillating direction (X), the width direction (Y) and the thickness direction (Z) is obtained. It is noted that the set of g-sensitivities with respect to the oscillating direction (X) is of particular interest.

As shown in FIG. 6, within the range between 20 and 2000 hertz, the set of g-sensitivities with respect to the oscillating direction (X) ranges between about 0.4 and about 0.8 (ppb/g).

Figure 7:
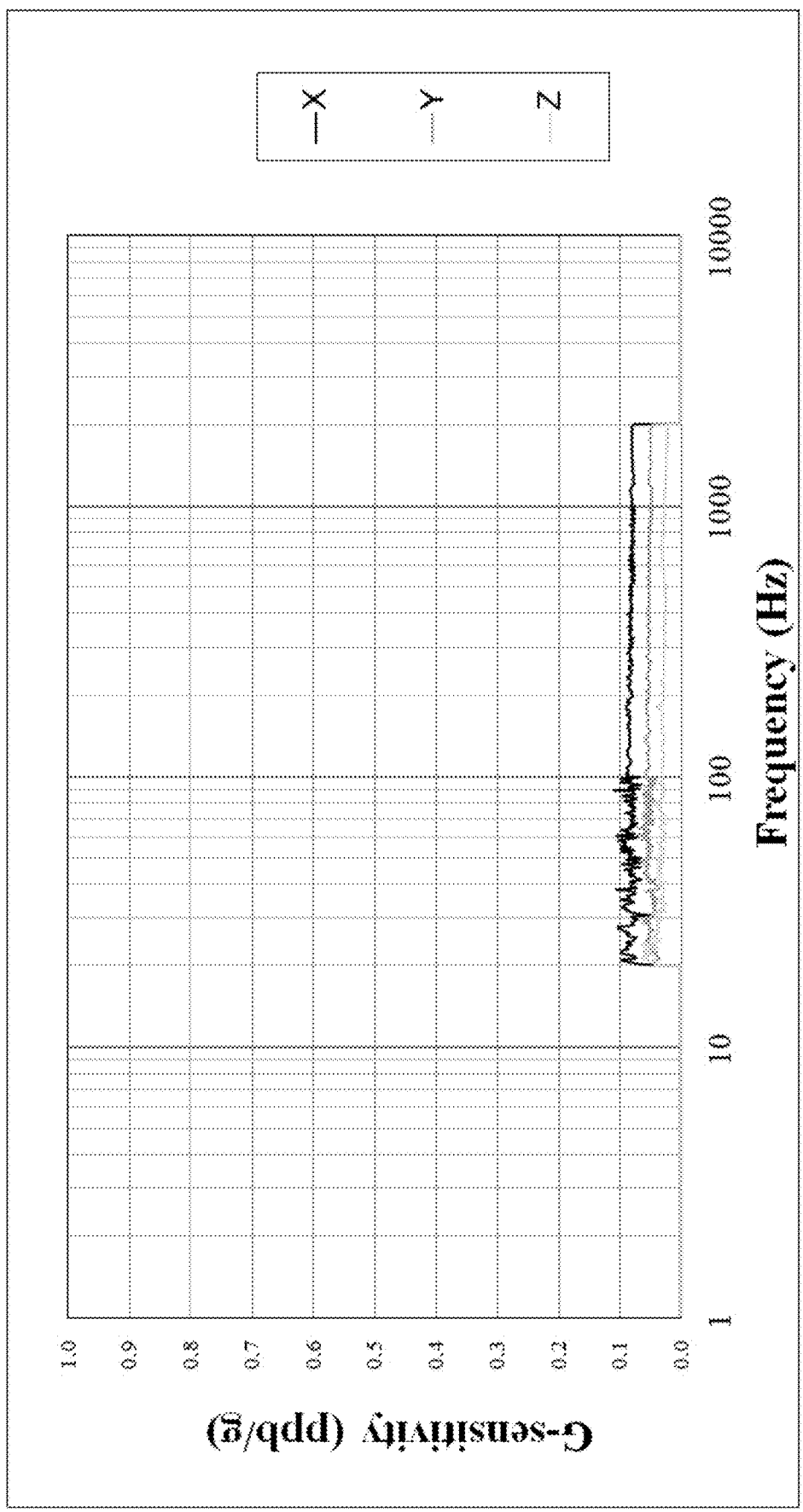
FIG. 7 is a chart illustrating test results of different g-sensitivities of the crystal resonator in the embodiment of FIG. 2 at different vibrating frequencies.

FIG. 7 is a chart illustrating test results of different g-sensitivities of the crystal resonator 100 in the embodiment of FIG. 2 at different oscillating frequencies. In FIG. 7, when the electrical signals that are identical to those as described in FIG. 6 are applied, the oscillating frequencies may be in a range between 20 and 2000 hertz, and a set of g-sensitivities with respect to each of the oscillating direction (X), the width direction (Y) and the thickness direction (Z) is obtained. As shown in FIG. 7, within the range between 20 and 2000 hertz, the set of g-sensitivities with respect to the oscillating direction (X) remains below 0.2 and close to 0.1 (ppb/g).

Comparing the data of FIG. 6 and FIG. 7 can yield the result that the g-sensitivities of the crystal resonator 100 in the embodiment of FIG. 2 with respect to the oscillating direction (X) is significantly lower than those of the conventional crystal resonator. That is to say, the configuration of the crystal resonator 100 in the embodiment of FIG. 2 facilitates a significant improvement in terms of reducing the g-sensitivities.

Figure 8:
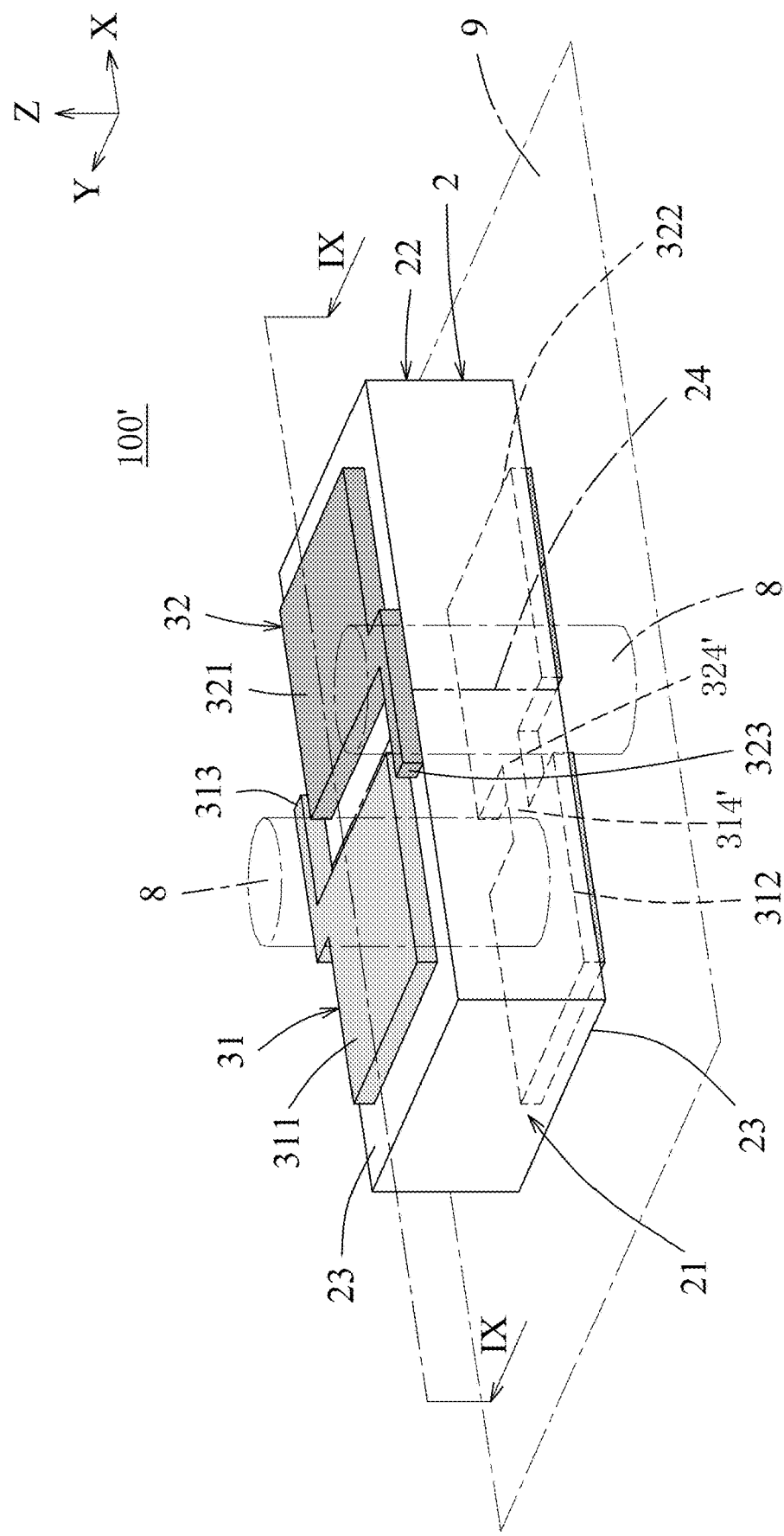
FIG. 8 is a perspective view of a crystal resonator according to one embodiment of the disclosure.

FIG. 8 is a perspective view of a crystal resonator 100' according to one embodiment of the disclosure. The crystal resonator 100' in the embodiment of FIG. 8 also includes a crystal plate 2 and an electrode set 3. The crystal plate 2 has a configuration that is similar to that of the embodiment of FIG. 2, and the details thereof are omitted herein for the sake of brevity.

The electrode set 3 includes a first electrode pair 31 that is disposed on the first vibration section 21, and a second electrode pair 32 that is disposed on the second vibration section 22.

Figure 9:
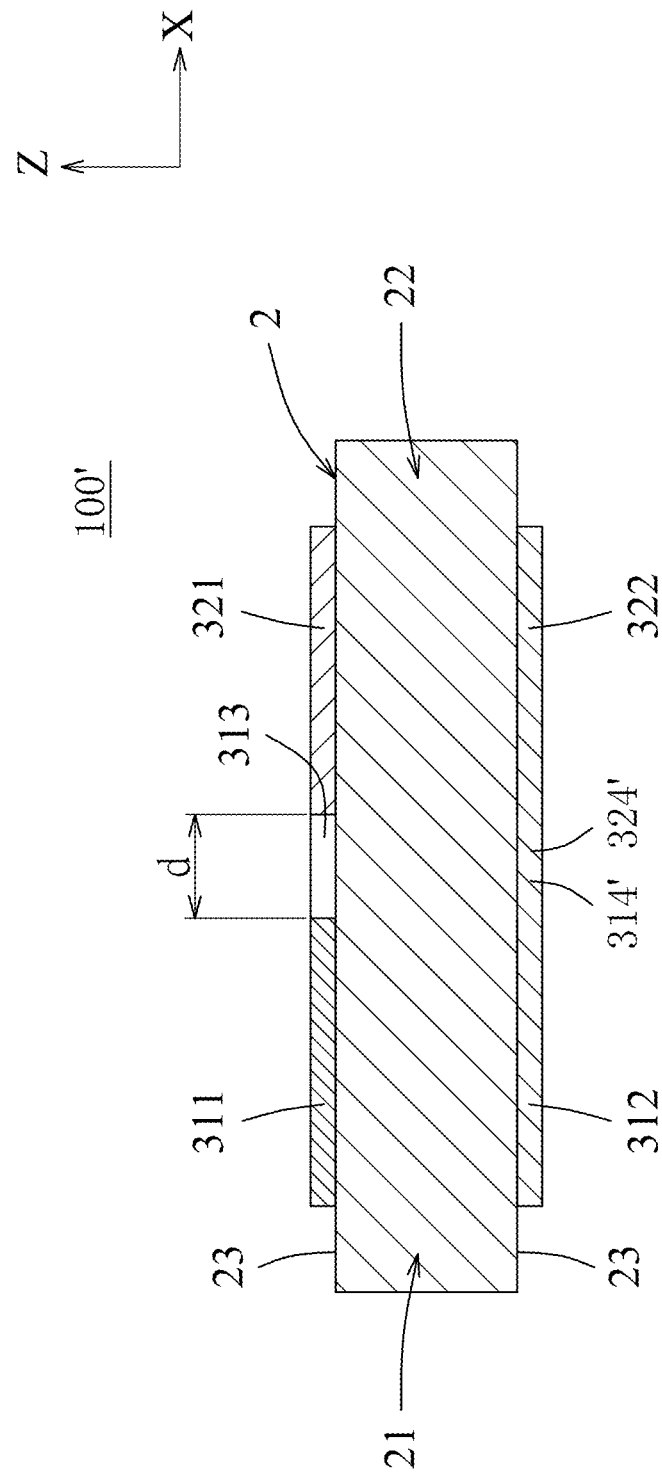
FIG. 9 is a fragmentary sectional view of the crystal resonator taken along line IX-IX in FIG. 8 and omitting the conductive securing members and the base.

FIG. 9 is a fragmentary sectional view of the crystal resonator 100' taken along line IX-IX in FIG. 8 and omitting the conductive securing members 8 and the base 9.

The first electrode pair 31 includes an input node electrode 311, a back electrode 312, an input node connecting electrode 313 and a back connecting electrode 314'. The second electrode pair 32 includes an output node electrode 321, a back electrode 322, an output node connecting electrode 323 and a back connecting electrode 324'.

The electrode set 3 of the embodiment of FIG. 8 differs from the electrode set 3 of the embodiment of FIG. 2, which lies in that the back connecting electrode 314' and the back connecting electrode 324' are connected to each other and are electrically isolated from each of the conductive securing members 8. Specifically, the back connecting electrode 314' has one end connected to the back electrode 312, and an opposite end extending toward the back electrode 322 and connected to the back connecting electrode 324'. The back connecting electrode 324' has one end connected to the back electrode 322, and an opposite end extending toward the back electrode 312 and connected to the back connecting electrode 314' . . . . As such, the back electrode 312 and the back electrode 322 have a same electrical potential (e.g., a ground potential).

Figure 10:
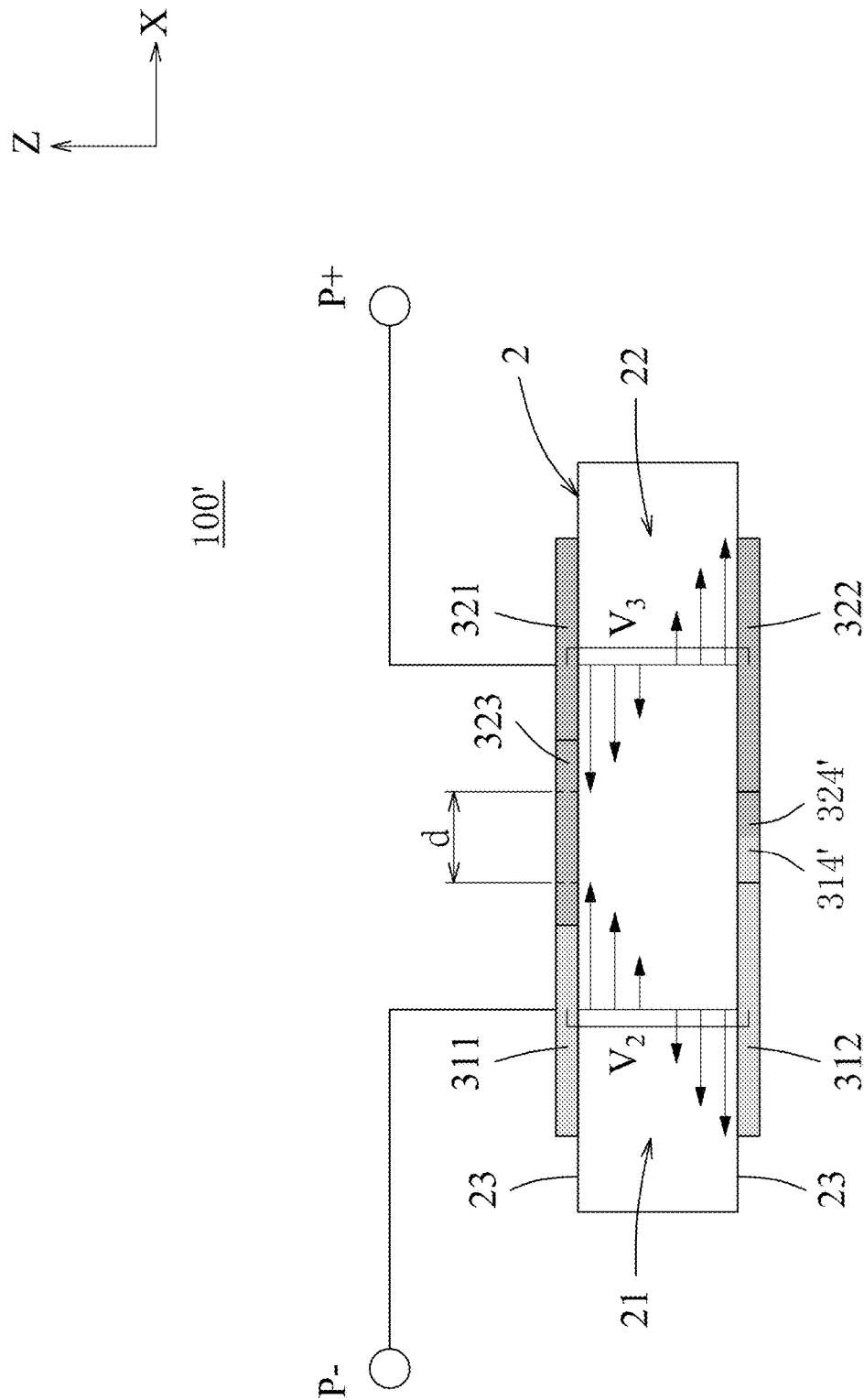
FIG. 10 illustrates movements in the crystal resonator in response to receipt of electrical signals via the electrode set.

FIG. 10 illustrates movements in the crystal resonator 100' in response to receipt of electrical signals via the electrode set 3. In use, the electrical signals are applied to the input node electrode 311 and the output node electrode 321, and one of the electrical signals has a positive electrical potential and the other one of the electrical signals has a negative electrical potential.

For example, in FIG. 10, the output node electrode 321 receives a positive electrical potential P+, and the input node electrode 311 receives a negative electrical potential P−. As a result, an applied voltage $V_2$ between the input node electrode 311 and the back electrode 312 is created, and another applied voltage $V_3$ that is between the output node electrode 321 and the back electrode 322 and that has an opposite electrical polarity to the applied voltage $V_0$ is created. The applied voltages $V_2$ and the applied voltage Vs cooperatively cause an upper part of the first vibration section 21 and an upper part of the second vibration section 22 to move toward each other along the oscillating direction (X), and cause a lower part of the first vibration section 21 and a lower part of the second vibration section 22 to move away from each other along the oscillating direction (X). In this configuration, while the first vibration section 21 and the second vibration section 22 are oscillating as described above and shown in FIG. 10, an external force applied to the crystal plate 2 may be partially nullified by the opposite oscillations of the parts of the first vibration section 21 and the second vibration section 22. As such, the undesired effect of frequency shift resulting from acceleration caused by the external force applied to the crystal plate 2 may be reduced, and therefore a g-sensitivity of the crystal resonator 100' is reduced.

Figure 11:
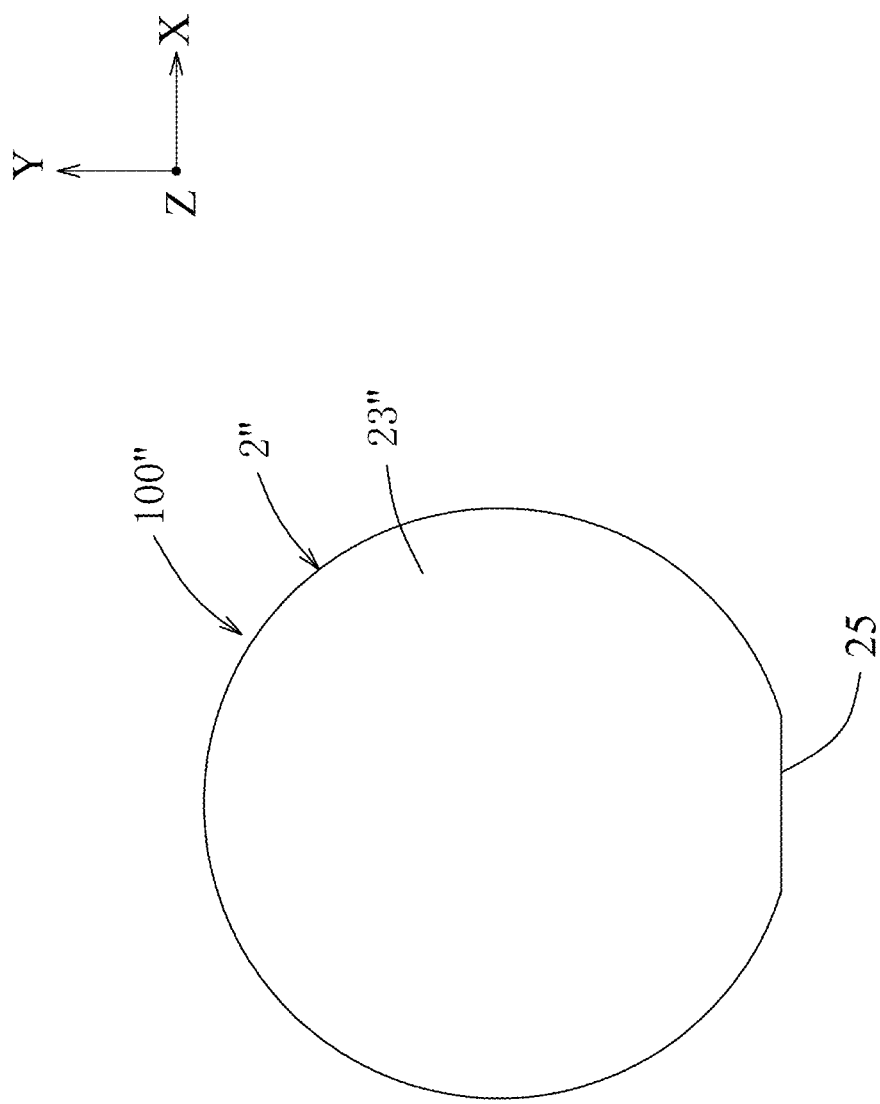
FIG. 11 is a top view of a crystal plate of a crystal resonator according to one embodiment of the disclosure.

FIG. 11 is a top view of a crystal plate 2" of a crystal resonator 100" according to one embodiment of the disclosure. In the embodiment of FIG. 11, the crystal plate 2" is in the shape of a circular sheet, and has a crystal surface 23" (e.g., the top surface of the crystal plate 2") with a shape of substantially a circle, and with a cutoff surface 25 extending along a plane parallel to the thickness direction (Z). The cutoff surface 25 may be formed by cutting the crystal plate 2" with respect to the thickness direction (Z), and has two opposite straight vertical edges that are connected to the crystal surface 23" and that extend along the thickness direction (Z), and two horizontal edges that are substantially straight and that respectively serve as a part of a peripheral of the crystal surface 23" and a part of a peripheral of a bottom surface of the crystal plate 2". In this configuration, the cutoff surface 25 may be utilized to define at least one crystallographic axis of the crystal plate 2", and as a result the cutoff surface 25 may be useful for aligning the crystal resonator 100" with other external components. It is noted that the shape of the cutoff surface 25 is not limited to that as depicted in FIG. 11, and other shapes of the cutoff surface 25 may be acceptable as long as the cutoff surface 25 can be utilized to define at least one crystallographic axis of the crystal plate 2".

Figure 12:
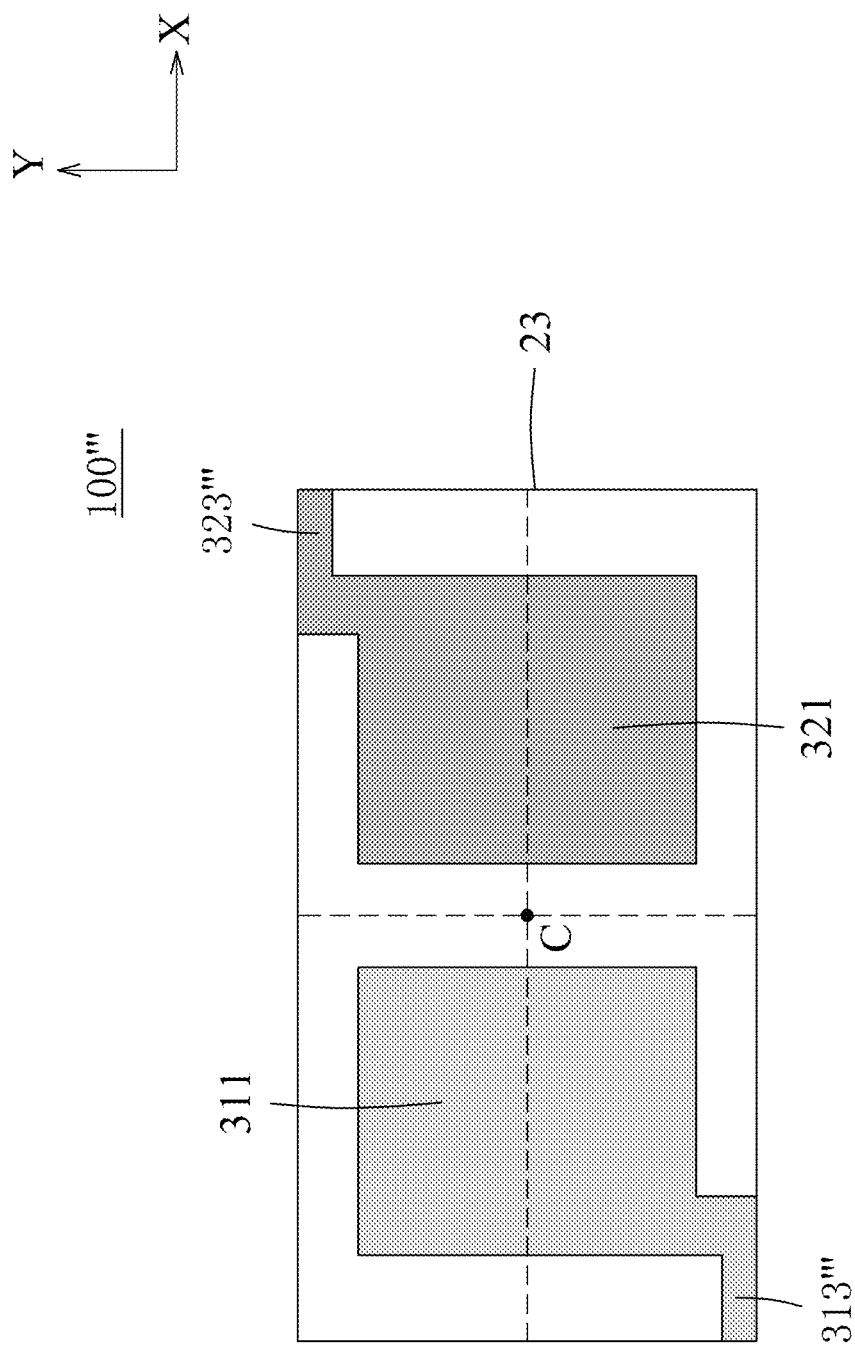
FIG. 12 is a top view of a crystal resonator according to one embodiment of the disclosure.

FIG. 12 is a fragmentary top view of a crystal resonator 100" according to one embodiment of the disclosure. The crystal resonator 100" in the embodiment of FIG. 12 also includes a crystal plate 2 (not shown) and an electrode set 3 (not shown). The crystal plate 2 has a configuration that is similar to that of the embodiment of FIG. 2, and the details thereof are omitted herein for the sake of brevity.

The first electrode pair 31 includes an input node electrode 311, a back electrode 312, an input node connecting electrode 313''' and a back connecting electrode 314. The second electrode pair 32 includes an output node electrode 321, a back electrode 322, an output node connecting electrode 323''' and a back connecting electrode 324.

The electrode set 3 of the embodiment of FIG. 12 differs from the electrode set 3 of the embodiment of FIG. 2 in the manner in which the input node electrode 311, the input node connecting electrode 313''', the output node electrode 321 and the output node connecting electrode 323''' are disposed.

Specifically, in this embodiment, the input node electrode 311 and the output node electrode 321 have the same shape, the input node connecting electrode 313''' and the output node connecting electrode 323''' have the same shape, and the input node electrode 311, the input node connecting electrode 313''', the output node electrode 321 and the output node connecting electrode 323''' are disposed on the crystal plate 2 in a centrosymmetric manner with respect to the central point of the crystal surface 23. For example, as shown in FIG. 12, the central point of the crystal surface 23 is labeled as a point (C). The input node connecting electrode 313''' is disposed at a left-bottom corner of the crystal surface 23, and the output node connecting electrode 323''' is disposed at an upper-right corner of the crystal surface 23. In this configuration, the locations of the conductive securing members 8 may be shifted to accommodate the changes on locations of the input node connecting electrode 313" and the output node connecting electrode 323'''. As a result, the crystal plate 2 may be supported by the conductive securing members 8 from two corners connected by a diagonal, and therefore a left side and a right side of the crystal plate 2 may be more firmly supported.

Figure 13:
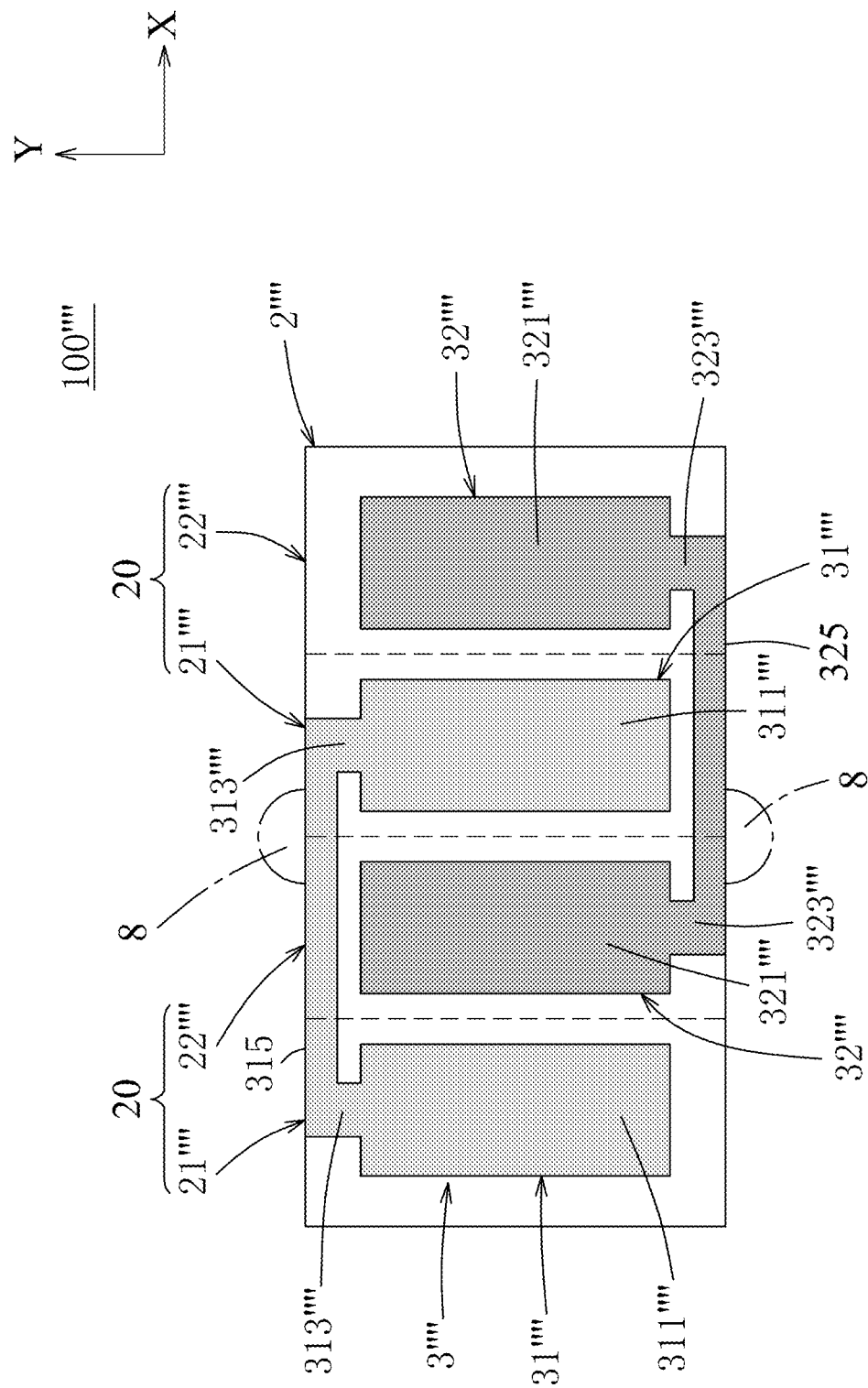
FIG. 13 is a top view of a crystal resonator according to one embodiment of the disclosure.

FIG. 13 is a top view of a crystal resonator 100"" according to one embodiment of the disclosure. The crystal resonator 100"" in the embodiment of FIG. 13 includes a crystal plate 2"" and an electrode set 3"". The crystal plate 2"" is formed integrally, and is cut in a specific manner to support a specific oscillation mode, such as a thickness shear mode. In the thickness shear mode, the crystal plate 2"" may be driven to oscillate in the oscillating direction (X).

The crystal resonator 100"" of the embodiment of FIG. 13 differs from the crystal resonator 100 of the embodiment of FIG. 2 as described in the following. The crystal plate 2"" includes a plurality of oscillating assemblies 20 that are arranged along the oscillating direction (X) and that are connected to one another. In FIG. 13, two oscillating assemblies 20 are present, but in other embodiments, one or more oscillating assemblies 20 may be provided.

Each of the oscillating assemblies 20 includes a first vibration section 21"" and a second vibration section 22"". For the plurality of oscillating assemblies 20, the first vibration sections 21"" and the second vibration sections 22"" are arranged alternately along the oscillating direction (X).

The electrode set 3"" includes a plurality of first electrode pairs 31"", and a plurality of second electrode pairs 32"". Each of the oscillating assemblies 20 corresponds with one of the first electrode pairs 31"", and one of the second electrode pairs 32"". In FIG. 13, two first electrode pairs 31"" and two second electrode pairs 32"" are present, but in other embodiments, one or more oscillating assemblies 20 may be provided so long as the number of the oscillating assemblies 20 is equal to the number of the first electrode pairs 31"" and the number of the second electrode pairs 32"" (i.e., the number of the oscillating assemblies 20, the number of the first electrode pairs 31"" and the number of the second electrode pairs 32"" are the same).

Each of the first electrode pairs 31"" is disposed on the first vibration section 21"" of a corresponding one of the oscillating assemblies 20, and includes an input node electrode 311"" disposed on a top surface of the corresponding one of the oscillating assemblies 20, a back electrode (not depicted), an input node connecting electrode 313"" connected to the input node electrode 311"", and a back connecting electrode (not depicted). The input node electrodes 311"" of the first electrode pairs 31"" are spaced apart from one another along the oscillating direction (X). The input node connecting electrodes 313"" of the first electrode pairs 31"" are connected to one another using a connecting part 315, and are electrically connected to one of the conductive securing members 8. As such, all of the input node electrodes 311"" are configured to have a same electrical potential.

Each of the second electrode pairs 32"" is disposed on the second vibration section 22"" of a corresponding one of the oscillating assemblies 20, and includes an output node electrode 321"" disposed on a top surface of the corresponding one of the oscillating assemblies 20, a back electrode (not depicted), an output node connecting electrode 323"" connected to the output node electrode 321"", and a back connecting electrode (not depicted). The output node electrodes 321"" of the second electrode pairs 32"" are spaced apart from one another along the oscillating direction (X). The output node connecting electrodes 323"" of the second electrode pairs 32"" are connected to one another using a connecting part 325, and are electrically connected to the other one of the conductive securing members 8. As such, all of the output node electrodes 321"" are configured to have a same electrical potential. In this embodiment, the electrical potential of the input node electrodes 311"" is different from the electrical potential of the output node electrodes 321"".

The back electrode of each of the first electrode pairs 31"" may be configured to have an electrical potential that is different from the electrical potential of the input node electrodes 311"". For example, the back electrode of each of the first electrode pairs 31"" may be connected to the other one of the conductive securing members 8, so as to have the same electrical potential with the output node electrodes 321"".

The back electrode of each of the second electrode pairs 32"" may be configured to have an electrical potential that is different from the electrical potential of the output node electrodes 321"". For example, the back electrode of each of the second electrode pairs 32"" may be connected to the one of the conductive securing members 8 in a similar configuration as shown in FIG. 4, so as to have the same electrical potential with the input node electrodes 311"".

Alternatively, the back electrode of each of the first electrode pairs 31"" and the back electrode of each of the second electrode pairs 32"" may be connected with one another, so as to share the same electrical potential (e.g., a ground potential) in a similar configuration as shown in FIG. 8. In this scenario, the electrical potential of the input node electrodes 311"" has an electrical polarity opposite to that of the electrical potential of the output node electrodes 321"".

In use, when the input node electrodes 311"" are applied with one of a high applied electrical potential and a low applied electrical potential, the output node electrodes 321"" are applied with the other one of the high applied electrical potential and the low applied electrical potential. Because of the above design associated with the back electrode of each of the first electrode pairs 31"" and the back electrode of each of the second electrode pairs 32"", an applied voltage that is between the input node electrode 311"" and the back electrode with respect to each of the first electrode pairs 31"" is created, and another applied voltage that is between the output node electrode 321"" and the back electrode with respect to each of the second electrode pairs 32"" and that has an opposite electrical polarity to the applied voltage is created. The applied voltages cooperatively cause each of the oscillating assemblies 20 to oscillate in a manner as described in the previous embodiments. In this configuration, an external force applied to the crystal plate 2 may be partially nullified by the oscillations of the oscillating assemblies 20. As such, the undesired effect of frequency shift resulting from acceleration caused by the external force applied to the crystal plate 2"" may be reduced, and therefore a g-sensitivity of the crystal resonator 100"" is reduced.

Figure 14:
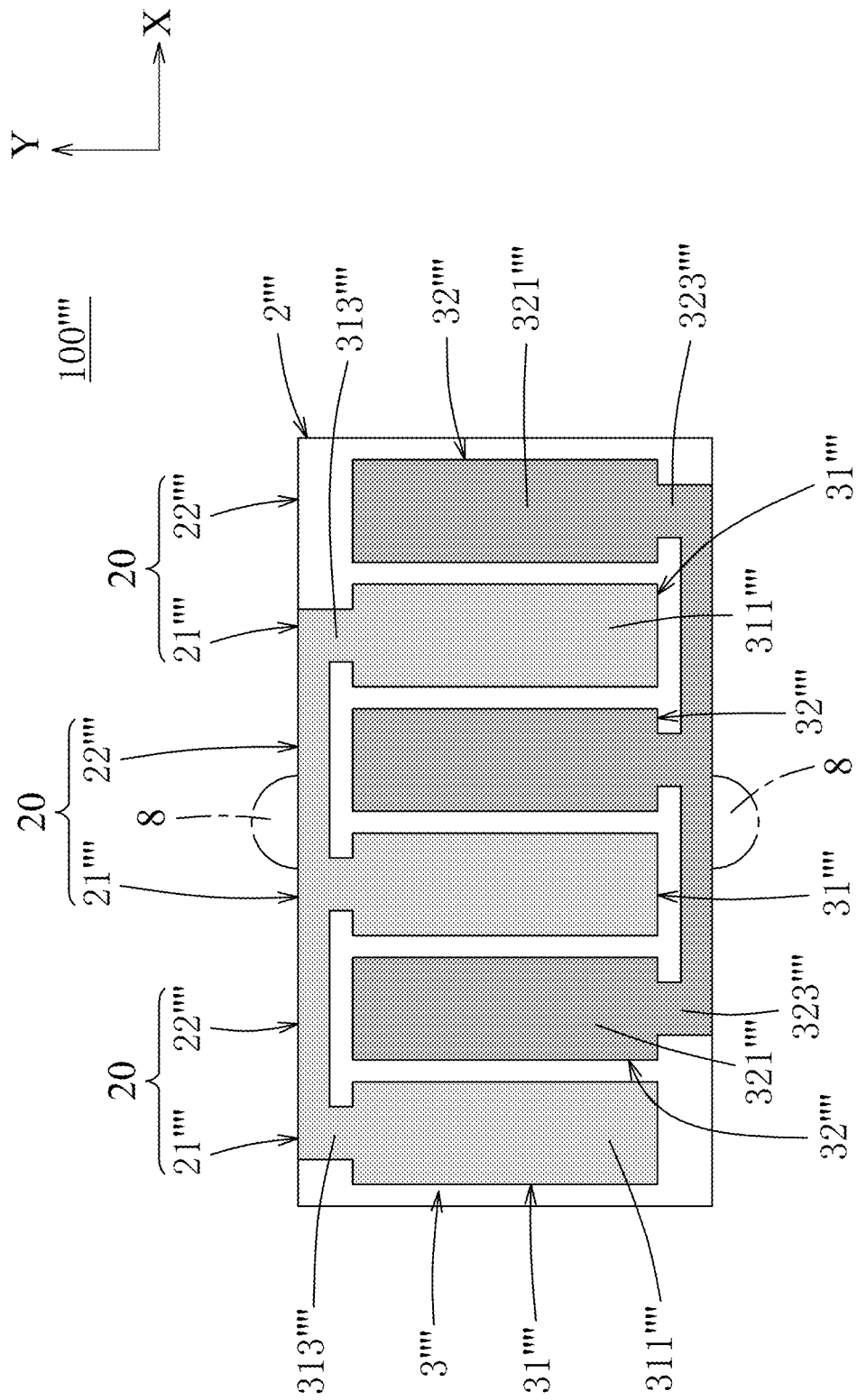
FIG. 14 is a top view of a crystal resonator according to one embodiment of the disclosure.

FIG. 14 is a top view of a crystal resonator 100"" according to one embodiment of the disclosure. The crystal resonator 100"" in the embodiment of FIG. 14 also includes a crystal plate 2"" and an electrode set 3"".

In the embodiment of FIG. 14, three oscillating assemblies 20 are present, three first electrode pairs 31"" are present and are disposed on the oscillating assemblies 20, respectively, and three second electrode pairs 32"" are present and are disposed on the oscillating assemblies 20, respectively. It is noted that in other embodiments, additional oscillating assemblies 20, first electrode pairs 31"" and second electrode pairs 32"" may be provided. The embodiment of FIG. 14 has the configurations and effects similar to those as described in the embodiment of FIG. 13, with the back electrode of each of the first electrode pairs 31"" and the back electrode of each of the second electrode pairs 32"" being in a similar configuration as shown in FIG. 4 or 8.

In general, for each of the first electrode pairs 31"" and each of the second electrode pairs 32"" disposed on a same oscillating assembly 20, the first electrode pair 31"" and the second electrode pair 32"" are configured to apply two applied voltages with opposite electrical polarities to the first vibration section 21"" and the second vibration section 22"", respectively, causing the first vibration section 21"" and the second vibration section 22"" to change shape in the thickness shear mode along the oscillating direction (X). In the thickness shear mode, upper parts of the first vibration section 21"" and the second vibration section 22"" move toward each other while lower parts of the first vibration section 21"" and the second vibration section 22"" move away from each other.

To sum up, embodiments of the disclosure provide a crystal resonator with a reduced g-sensitivity. Specifically, a crystal plate of the crystal resonator is defined with a first vibration section and a second vibration section. For each of the first vibration section and the second vibration section, two applied voltages having opposite electrical polarities are applied, therefore causing different parts of the first vibration section and the second vibration section to separately move toward each other and move away from each other. As such, an external force applied to the crystal plate may be partially nullified by the opposite oscillations of the parts of the first vibration section and the second vibration section. As such, the undesired effect of frequency shift resulting from acceleration caused by the external force applied to the crystal plate may be reduced, and therefore a g-sensitivity of the crystal resonator is reduced.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A crystal resonator being connected to a base via two conductive securing members, the crystal resonator, comprising:
    a crystal plate that is formed integrally, and that includes a first vibration section and a second vibration section connected to each other and arranged along an oscillating direction not parallel to a thickness direction, the crystal plate exhibiting a thickness shear mode, in which the crystal plate is driven to dynamically deform in the oscillating direction when applied with two applied voltages; and
    an electrode set that includes a first electrode pair disposed on the first vibration section, and a second electrode pair disposed on the second vibration section, the first electrode pair and the second electrode pair being configured to apply the applied voltages with opposite electrical polarities to the first vibration section and the second vibration section, respectively, which causes the first vibration section and the second vibration section to dynamically deform in the thickness shear mode along the oscillating direction;
    wherein in the thickness shear mode, the first vibration section and the second vibration section do out of phase motion with respect to each other;
    wherein:
    the first electrode pair includes an input node electrode and a back electrode that are disposed on two opposite surfaces of the first vibration section and that are aligned with each other with respect to the thickness direction;
    the second electrode pair includes an output node electrode and a back electrode that are disposed on two opposite surfaces of the second vibration section and that are aligned with each other with respect to the thickness direction;
    the input node electrode of the first electrode pair and the output node electrode of the second electrode pair are disposed on a same surface of the crystal plate, and are arranged to be spaced apart from each other along the oscillating direction;
    one of the input node electrode and the output node electrode receives a high electrical potential, and the other one of the input node electrode and the output node electrode receives a low electrical potential; and
    the back electrode of the first electrode pair and the back electrode of the second electrode pair are arranged to be spaced apart from each other along the oscillating direction, the back electrode of the first electrode pair is connected to the output node electrode, and the back electrode of the second electrode pair is connected to the input node electrode; and
    wherein:
    the crystal plate is disposed to engage the conductive securing members, and is spaced apart from the base in the thickness direction;
    the first vibration section and the second vibration section are connected to each other via a junction surface that has two vertical edges extending along the thickness direction and connected to the conductive securing members, respectively;
    the first electrode pair further includes an input node connecting electrode that extends from the input node electrode, and that has an end connected to one of the conductive securing members; and
    the second electrode pair further includes an output node connecting electrode that extends from the output node electrode, and that has an end connected to the other one of the conductive securing members.

2. The crystal resonator as claimed in claim 1, wherein the crystal plate further includes two opposite crystal surfaces extending in parallel along the oscillating direction and perpendicular to the thickness direction, each of the crystal surfaces having a shape of one of a polygon, a circle and an ellipse.

3. The crystal resonator as claimed in claim 1, wherein the input node electrode and the output node electrode are disposed to be spaced apart from each other by a predetermined distance that is between 0 and 0.5 millimeter.

4. The crystal resonator as claimed in claim 1, wherein each of the input node electrode and the output node electrode has an upper side extending along the oscillating direction and perpendicular to the thickness direction, and the upper side is in a shape of one of a polygon, a circle, and an ellipse.

5. The crystal resonator as claimed in claim 1, wherein:
the crystal plate includes a plurality of oscillating assemblies that are arranged along the oscillating direction and that are connected to one another;
each of the oscillating assemblies includes the first vibration section and the second vibration section, for the plurality of oscillating assemblies, the first vibration section and the second vibration section being arranged alternately along the oscillating direction;
the electrode set includes a plurality of first electrode pairs that are connected to one another, and a plurality of second electrode pairs that are connected to one another, each of the first electrode pairs being disposed on the first vibration section of a corresponding one of the oscillating assemblies, and each of the second electrode pairs being disposed on the second vibration section of a corresponding one of the oscillating assemblies; and
for each of the first electrode pairs and each of the second electrode pairs disposed on a same oscillating assembly, the first electrode pair and the second electrode pair are configured to apply two applied voltages with opposite electrical polarities to the first vibration section and the second vibration section, respectively, which causes the first vibration section and the second vibration section to dynamically deform in the thickness shear mode along the oscillating direction, and the first vibration section and the second vibration section do out of phase motion with respect to each other.

6. A crystal resonator comprising:
a crystal plate that is formed integrally, and that includes a first vibration section and a second vibration section connected to each other and arranged along an oscillating direction not parallel to a thickness direction, the crystal plate exhibiting a thickness shear mode, in which the crystal plate is driven to dynamically deform in the oscillating direction when applied with two applied voltages; and
an electrode set that includes a first electrode pair disposed on the first vibration section, and a second electrode pair disposed on the second vibration section, the first electrode pair and the second electrode pair being configured to apply the applied voltages with opposite electrical polarities to the first vibration section and the second vibration section, respectively, which causes the first vibration section and the second vibration section to dynamically deform in the thickness shear mode along the oscillating direction;
wherein in the thickness shear mode, the first vibration section and the second vibration section do out of phase motion with respect to each other; and
wherein:
the first electrode pair includes an input node electrode and a back electrode that are disposed on two opposite surfaces of the first vibration section and that are aligned with each other with respect to the thickness direction;
the second electrode pair includes an output node electrode and a back electrode that are disposed on two opposite surfaces of the second vibration section and that are aligned with each other with respect to the thickness direction;
the input node electrode of the first electrode pair and the output node electrode of the second electrode pair are disposed on a same surface of the crystal plate, and are arranged to be spaced apart from each other along the oscillating direction;
one of the input node electrode and the output node electrode receives a high applied electrical potential, and the other one of the input node electrode and the output node electrode receives a low applied electrical potential; and
the back electrode of the first electrode pair and the back electrode of the second electrode pair are electrically connected to each other.

7. The crystal resonator as claimed in claim 6, wherein the input node electrode and the output node electrode are disposed to be spaced apart from each other by a predetermined distance that is between 0 and 0.5 millimeter.

8. The crystal resonator as claimed in claim 6, wherein each of the input node electrode and the output node electrode has an upper side extending along the oscillating direction and perpendicular to the thickness direction, and the upper side is in a shape of one of a polygon, a circle, and an ellipse.

9. The crystal resonator as claimed in claim 6, being connected to a base via two conductive securing members, wherein:
the crystal plate is disposed to engage the conductive securing members, and is spaced apart from the base in the thickness direction;
the first vibration section and the second vibration section are connected to each other via a junction surface that has two vertical edges extending along the thickness direction and connected to the conductive securing members, respectively;
the first electrode pair further includes an input node connecting electrode that extends from the input node electrode, and that has an end connected to one of the conductive securing members; and
the second electrode pair further includes an output node connecting electrode that extends from the output node electrode, and that has an end connected to the other one of the conductive securing members.

10. The crystal resonator as claimed in claim 6, wherein:
the crystal plate includes a plurality of oscillating assemblies that are arranged along the oscillating direction and that are connected to one another;
each of the oscillating assemblies includes the first vibration section and the second vibration section, for the plurality of oscillating assemblies, the first vibration section and the second vibration section being arranged alternately along the oscillating direction;
the electrode set includes a plurality of first electrode pairs that are connected to one another, and a plurality of second electrode pairs that are connected to one another, each of the first electrode pairs being disposed on the first vibration section of a corresponding one of the oscillating assemblies, and each of the second electrode pairs being disposed on the second vibration section of a corresponding one of the oscillating assemblies; and
for each of the first electrode pairs and each of the second electrode pairs disposed on a same oscillating assembly, the first electrode pair and the second electrode pair are configured to apply two applied voltages with opposite electrical polarities to the first vibration section and the second vibration section, respectively, which causes the first vibration section and the second vibration section to dynamically deform in the thickness shear mode along the oscillating direction, and the first vibration section and the second vibration section do out of phase motion with respect to each other.

11. The crystal resonator as claimed in claim 6, wherein the crystal plate further includes two opposite crystal surfaces extending in parallel along the oscillating direction and perpendicular to the thickness direction, each of the crystal surfaces having a shape of one of a polygon, a circle and an ellipse.

12. The crystal resonator as claimed in claim 11, wherein the crystal plate has a cutoff surface extending along a plane parallel to the thickness direction, the cutoff surface being utilized to define at least one crystallographic axis of the crystal plate.

* * * * *